(12) United States Patent
Wang et al.

(10) Patent No.: US 9,830,029 B2
(45) Date of Patent: Nov. 28, 2017

(54) IN-CELL TOUCH PANEL AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Lei Wang, Beijing (CN); Hailin Xue, Beijing (CN); Yanna Xue, Beijing (CN); Hongliang Yuan, Beijing (CN); Yingming Liu, Beijing (CN); Chunlei Wang, Beijing (CN); Haisheng Wang, Beijing (CN); Xiaochuan Chen, Beijing (CN); Shijun Wang, Beijing (CN); Rui Xu, Beijing (CN); Xiaobo Xie, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 44 days.

(21) Appl. No.: 14/648,034

(22) PCT Filed: Sep. 22, 2014

(86) PCT No.: PCT/CN2014/087023
§ 371 (c)(1),
(2) Date: May 28, 2015

(87) PCT Pub. No.: WO2015/180318
PCT Pub. Date: Dec. 3, 2015

(65) Prior Publication Data
US 2016/0048240 A1 Feb. 18, 2016

(30) Foreign Application Priority Data
May 30, 2014 (CN) .......................... 2014 1 0240491

(51) Int. Cl.
*G06F 3/044* (2006.01)
*G06F 3/041* (2006.01)
(Continued)

(52) U.S. Cl.
CPC ............ *G06F 3/044* (2013.01); *G06F 3/0412* (2013.01); *G06F 3/0416* (2013.01);
(Continued)

(58) Field of Classification Search
CPC . G06F 2203/04103; G06F 2203/04112; G06F 2203/04808
See application file for complete search history.

(56) References Cited

U.S. PATENT DOCUMENTS

2008/0309627 A1 12/2008 Hotelling et al.
2009/0224362 A1* 9/2009 Lu .......................... H01L 28/82
257/532
(Continued)

FOREIGN PATENT DOCUMENTS

CN 102650916 A 8/2012
CN 202976049 U 6/2013
(Continued)

OTHER PUBLICATIONS

International Search Report and Written Opinion dated Feb. 27, 2015; PCT/CN2014/087023.
(Continued)

*Primary Examiner* — Nelson Rosario
*Assistant Examiner* — Chun-Nan Lin
(74) *Attorney, Agent, or Firm* — Ladas & Parry LLP

(57) ABSTRACT

An in-cell touch panel and a display device are disclosed. In the in-cell touch panel, a plurality of mutually independent
(Continued)

self-capacitance electrodes arranged in the same layer are disposed on an array substrate in accordance the self-capacitance principle; a touch detection chip can determine the touch position by the detection of the capacitance variation of the self-capacitance electrodes; leads arranged in the same layer as pixel electrodes are disposed at gaps between the pixel electrodes and configured to connect the self-capacitance electrodes to the touch detection chip. The touch panel can reduce the manufacturing cost and improve the productivity.

18 Claims, 6 Drawing Sheets

(51) Int. Cl.
  *G06F 3/0488* (2013.01)
  *G09G 3/36* (2006.01)
  *H05K 1/02* (2006.01)

(52) U.S. Cl.
  CPC ....... *G06F 3/04883* (2013.01); *G09G 3/3659* (2013.01); *H05K 1/0296* (2013.01); *G06F 2203/04103* (2013.01); *G06F 2203/04112* (2013.01); *G06F 2203/04808* (2013.01); *G09G 3/3648* (2013.01); *G09G 2300/0809* (2013.01); *G09G 2320/0252* (2013.01); *H05K 2201/09227* (2013.01); *H05K 2201/09245* (2013.01); *H05K 2201/10128* (2013.01); *H05K 2201/10151* (2013.01)

(56) References Cited

U.S. PATENT DOCUMENTS

| | | | |
|---|---|---|---|
| 2011/0242028 A1* | 10/2011 | Lee | G06F 3/0418 345/173 |
| 2012/0044166 A1* | 2/2012 | Mizuhashi | G06F 3/0412 345/173 |
| 2014/0092036 A1* | 4/2014 | Lin | G06F 3/0412 345/173 |
| 2014/0125630 A1* | 5/2014 | Wang | G06F 3/044 345/174 |
| 2014/0267128 A1* | 9/2014 | Bulea | G06F 3/044 345/174 |
| 2014/0362031 A1* | 12/2014 | Mo | G09G 3/36 345/174 |
| 2016/0018922 A1 | 1/2016 | Wang et al. | |
| 2016/0048240 A1 | 2/2016 | Wang et al. | |
| 2016/0132166 A1 | 5/2016 | Kim et al. | |

FOREIGN PATENT DOCUMENTS

| | | |
|---|---|---|
| CN | 103279245 A | 9/2013 |
| CN | 203376696 U | 1/2014 |
| CN | 103793120 A | 5/2014 |
| CN | 104020891 A | 9/2014 |
| CN | 104020909 A | 9/2014 |
| CN | 104035640 A | 9/2014 |
| KR | 20120119368 A | 10/2012 |

OTHER PUBLICATIONS

First Chinese Office Action dated May 24, 2016; Appln. No. 201410240491.7.
Second Chinese Office Action dated Oct. 18, 2016; Appln. No. 201410240491.7.
Third Chinese Office Action dated Feb. 23, 2017; Appln. No. 201410240491.7.
USPTO FOA dated Dec. 20, 2016 in connection with U.S. Appl. No. 14/443,286.

\* cited by examiner

IN-CELL TOUCH PANEL AND DISPLAY DEVICE

TECHNICAL FIELD

Embodiments of the present invention relate to an in-cell touch panel and a display device.

BACKGROUND

With the rapid development of display technology, touch screen panels have been gradually widespread in people's lives. Currently, in view of the structures, the touch screen panels can be divided into: add-on mode touch panels, on-cell touch panels and in-cell touch panels. The add-on mode touch panel needs to separately produce a touch screen and a liquid crystal display (LCD) which are hence bonded together to form an LCD with touch function. The add-on mode touch panel has the defects of high manufacturing cost, low light transmittance and thick modules. The in-cell touch panel allows touch electrodes of a touch screen to be embedded into an LCD, not only can reduce the overall thickness of modules but also can greatly reduce the manufacturing cost of the touch panel, and is favored by the major panel manufacturers.

Currently, the in-cell touch panel detects the finger touch position in accordance with the mutual-capacitance or self-capacitance principle. A plurality of self-capacitance electrodes arranged in the same layer and insulated from each other are disposed in the touch panel in accordance with the self-capacitance principle. When a human body does not touch the screen, the capacitance of the self-capacitance electrode is at a fixed value. When a human body touches the screen, the capacitance of corresponding self-capacitance electrode is at a value of a fixed value plus the body capacitance. A touch detection chip can determine the touch position by the detection of the capacitance variation of the self-capacitance electrode in the touch period. As the body capacitance may act on the entire self-capacitance, compared with the case that the body capacitance can only act on the projected capacitance in the mutual capacitance, the touch variation, caused by the fact that the human body touches the screen, in the touch panel manufactured by utilization of the self-capacitance principle will be greater than that of a touch panel manufactured in accordance with the mutual-capacitance principle. Therefore, compared with a mutual-capacitance touch panel, a self-capacitance touch panel can effectively improve the signal-to-noise ratio of touch and hence improve the accuracy of touch sensing.

SUMMARY

At least one embodiment of the present invention provides an in-cell touch panel and a display device which can reduce the manufacturing cost of the in-cell touch panel and improve the productivity.

At least one embodiment of the present invention provides an in-cell touch panel, which comprises: an array substrate provided with pixel electrodes; a plurality of self-capacitance electrodes mutually independently arranged in the same layer and disposed on the array substrate; a touch detection chip configured to determine touch position by detection of capacitance variation of the self-capacitance electrodes; and leads arranged in a same layer as the pixel electrodes, disposed each at a gap between two adjacent pixel electrodes and configured to connect the self-capacitance electrodes to the touch detection chip.

At least one embodiment of the present invention provides a display device, which comprises the in-cell touch panel provided by an embodiment of the present invention.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. Obviously, the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

Thickness and the shape of layers in the accompanying drawings do not reflect the real scale and are only intended to illustrate the content of the present invention.

In the in-cell touch panel, in order to connect the self-capacitance electrodes to the touch detection chip, generally the leads connected correspondingly with the self-capacitance electrodes will be provided. Patterns of the leads and the self-capacitance electrodes may be arranged in the same layer or may be arranged in different layers. Although an extra patterning process is not necessarily added in the case that the leads and the self-capacitance electrodes are arranged in the same layer, touch dead areas will be formed. As all the leads connected with a plurality of self-capacitance electrodes in the touch dead area run through the touch dead area, the signals in the touch dead area are relatively disordered, so that the touch performance in the area cannot be guaranteed. In view of this, in specific implementation, the leads and the self-capacitance electrodes are generally arranged in different layers.

When the leads and the self-capacitance electrodes are arranged in different layers in the in-cell touch panel, two new layers must be added in the display panel, so that new processes must be added in the process of manufacturing the panel. Therefore, the manufacturing cost can be increased and the productivity cannot be improved.

Figure 1:
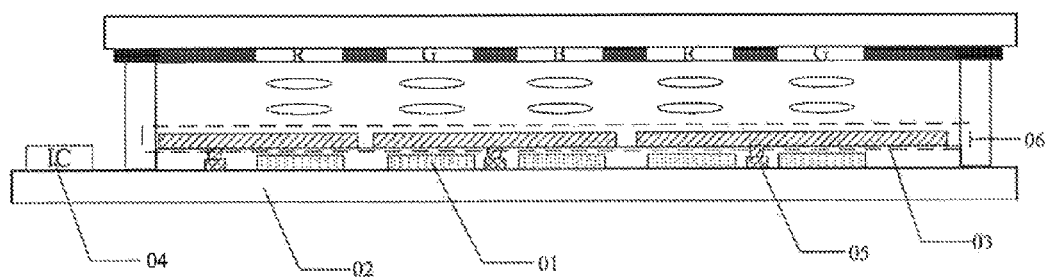
FIG. 1 is a schematic structural view of an in-cell touch panel provided by an embodiment of the present invention.

At least one embodiment of the present invention provides an in-cell touch panel which, as illustrated in FIG. 1, comprises an array substrate 02 provided with pixel electrodes 01 and further comprises: a plurality of self-capacitance electrodes 03 mutually independent arranged in the same layer and disposed on the array substrate 02; a touch detection chip 04 configured to determine the touch position by the detection of the capacitance variation of the self-capacitance electrodes 03 in a touch period; and leads 05 arranged in the same layer as the pixel electrodes 01, disposed at a gap between two adjacent pixel electrodes 01 and configured to connect the self-capacitance electrodes 03 to the touch detection chip 04.

Although the touch detection chip 04 is disposed on the second substrate 02 in FIG. 1, or the touch detection chip 04 may be disposed on the first substrate 01 or connected to the second substrate 02 through a flexible circuit board, etc.

In the in-cell touch panel provided by an embodiment of the present invention, the plurality of mutually independent self-capacitance electrodes 03 arranged in the same layer are disposed on the array substrate 02 in accordance with the self-capacitance principle; the touch detection chip 04 can determine the touch position by the detection of the capacitance variation of the self-capacitance electrode 03 in a touch period; and the leads 05 arranged in the same layer as the pixel electrodes 01 are disposed at the gaps between the pixel electrodes 01 and configured to connect the self-capacitance electrodes 03 to the touch detection chip 04.

In the touch panel provided by an embodiment of the present invention, a pattern of a pixel electrode layer is modified to form the leads 05 connected with the self-capacitance electrodes 03 at the gaps between the pixel electrodes 01. Therefore, compared with the manufacturing processes in which two layers of film must be added on the basis of the process for manufacturing an array substrate, the touch function can be achieved by only adding one process for forming the self-capacitance electrodes, so that the manufacturing cost can be reduced and the productivity can be improved.

Figure 2:
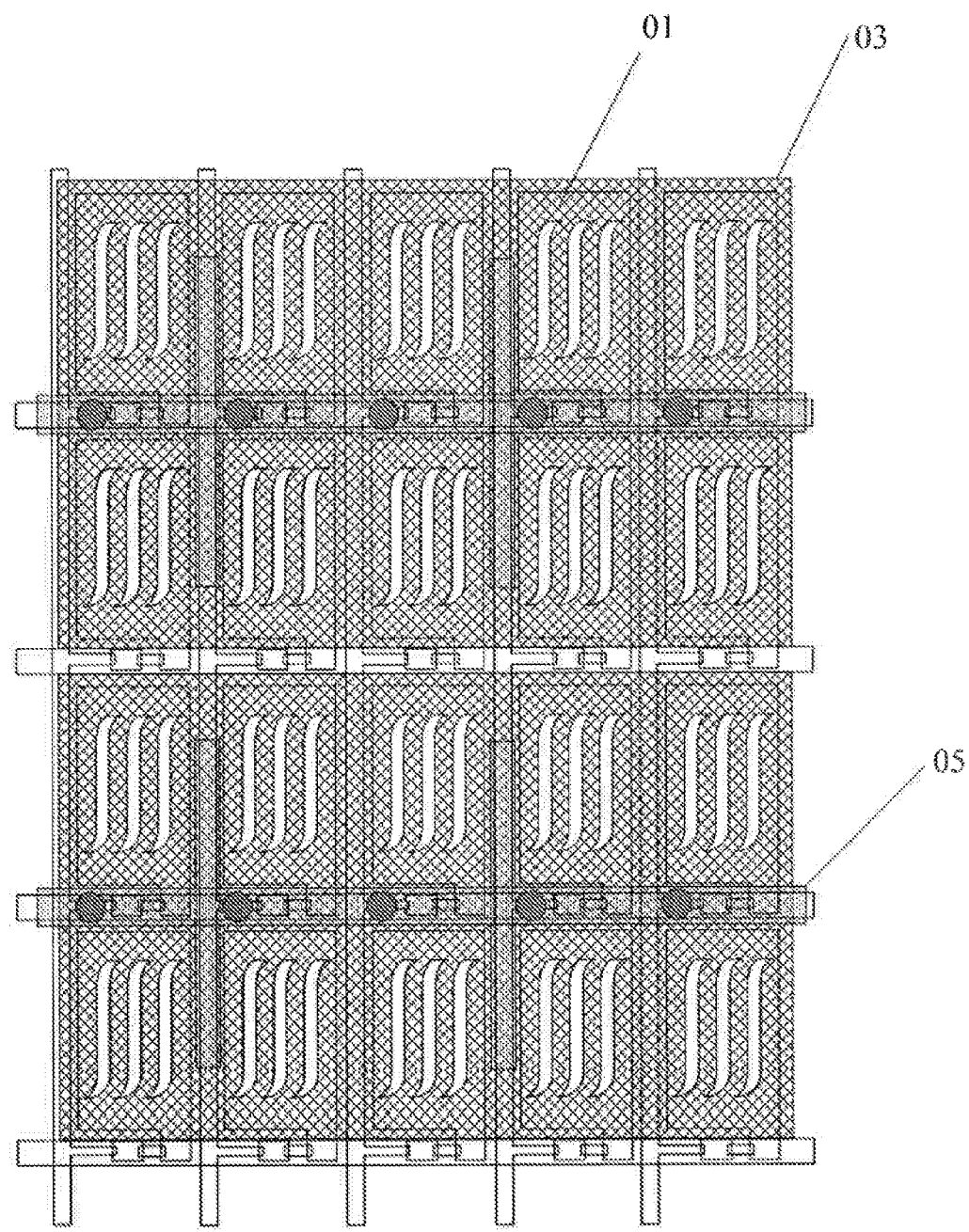
FIGS. 2 and 3 are respectively a schematic structural view of the in-cell touch panel provided by an embodiment of the present invention in which a common electrode layer is multiplexed as self-capacitance electrodes.

For instance, in the touch panel provided by at least one embodiment of the present invention, the aperture ratio of a display area cannot be affected by the leads 05 connected with the self-capacitance electrodes 03 and disposed at the gaps between the pixel electrodes 01. Moreover, the pattern of the leads 05 may be of a horizontal strip structure, a vertical strip structure or a crisscrossed latticed structure as shown in FIG. 2 according to actual design needs. No limitation will be given here.

The touch panel provided by the embodiment of the present invention not only is applicable to twisted nematic (TN) LCDs but also is applicable to advanced dimension switch (ADS) LCDs and in-plane switch (IPS) LCDs.

When the touch panel provided by at least one embodiment of the present invention is applied to an ADS LCD, as illustrated in FIGS. 1 and 2, the common electrode layer 06 in the array substrate 02 may be multiplexed/reused as the self-capacitance electrodes 03, namely the self-capacitance electrodes 03 as a whole constitute the common electrode layer 06 on the array substrate 02. When the structure of the common electrode layer 06 is modified and divided into the self-capacitance electrodes 03 to achieve the touch function, no additional process is additionally needed on the basis of the process for manufacturing an array substrate. Therefore, the manufacturing cost can be reduced and the productivity can be improved.

Moreover, when the touch panel provided by the embodiment of the present invention is applied to the traditional ADS LCD panel, the common electrode layer 06, as a plate electrode, is disposed on the lower layer (closer to a base substrate) and the pixel electrodes 01, as slit electrodes, are disposed on the upper layer (closer to a liquid crystal layer), namely the common electrode layer 06 is disposed between the pixel electrodes 01 and the array substrate 02. Moreover, an insulating layer may be disposed between the pixel electrodes 01 and the common electrode layer 06. When the touch panel provided by an embodiment of the present invention is applied to an HADS LCD panel, the pixel electrodes 01, as plate electrodes, are disposed on the lower layer (closer to a base substrate) and the common electrode layer 06, as slit electrodes, is disposed on the upper layer (closer to a liquid crystal layer), namely the pixel electrodes 01 are disposed between the common electrode layer 06 and the array substrate 02. Moreover, an insulating layer may also be disposed between the pixel electrode 01 and the common electrode layer 06.

In general, the resolution of the touch panel is generally in millimeter level, so that the density and the occupied area of the self-capacitance electrode 03 may be selected according to the required touch resolution so as to ensure the required touch resolution. Generally, the self-capacitance electrode 03 is designed to be a square electrode with the size of about 5 mm*5 mm. The resolution of a display is usually in micron level. Therefore, one self-capacitance electrode 03 may correspond to a plurality of pixels in the display.

In the in-cell touch panel provided by at least one embodiment of the present invention, when the common electrode layer 06, the whole layer of which is disposed on the array substrate 02, is divided into the plurality of self-capacitance electrodes 03, in order to not affect the normal display function, a variety of implementations may be adopted in the process of dividing the common electrode layer 06.

For instance, one implementation is as follows: dividing lines are configured away from the opening areas for display and disposed within an area provided with a pattern of a black matrix (BM) layer, namely an orthographic projection of a gap between two adjacent self-capacitance electrodes 03 on the array substrate 02 will usually be disposed at a gap between two adjacent pixel electrodes 01, as shown in FIG. 2.

Figure 3:
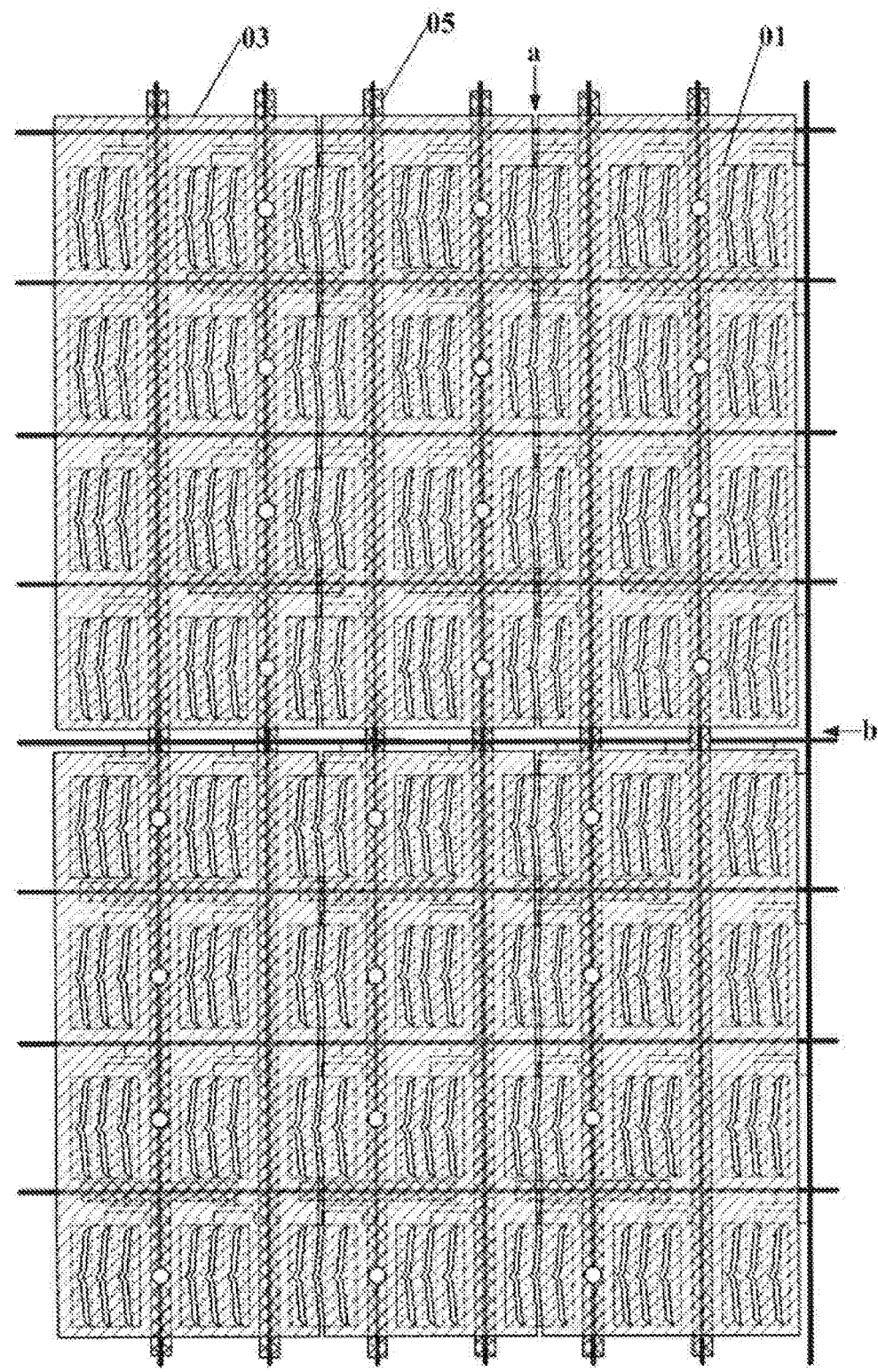

Another implementation is as follows: when the common electrode layer 06 is disposed above the pixel electrodes 01, namely the pixel electrodes 01 are disposed between the common electrode layer 06 and the array substrate 02, the common electrode layer 06 will be formed with strip slots "a" in areas corresponding to the pixel electrodes 01. As illustrated in FIG. 3, the common electrode layer 06 may be divided into the plurality of self-capacitance electrodes 03 along the original strip slots "a" of the common electrode layer 06 and the direction "b" intercrossing the strip slots. As the pattern of the common electrode layer 06 is not originally disposed at the strip slots "a", the arrangement of dividing gaps at the strip slots "a" will not affect normal display. But in the process of forming dividing gaps in the direction "b" intercrossing the strip slots "a", in order to not affect the normal display function, the dividing gaps in the direction "b" intercrossing the strip slots "a" should be kept away from the opening areas for display and disposed at an area provided with a pattern of a BM layer.

In the touch panel provided by at least one embodiment of the present invention, the common electrode layer 06 is multiplexed/reused as the self-capacitance electrodes 03, in order to reduce the mutual interference between display signals and touch signals, the time-sharing drive mode in the touch period and the display period may be adopted. In at least one embodiment, a display drive chip and a touch detection chip are integrated into one chip, so that the manufacturing cost can be further reduced.

Figure 4A:
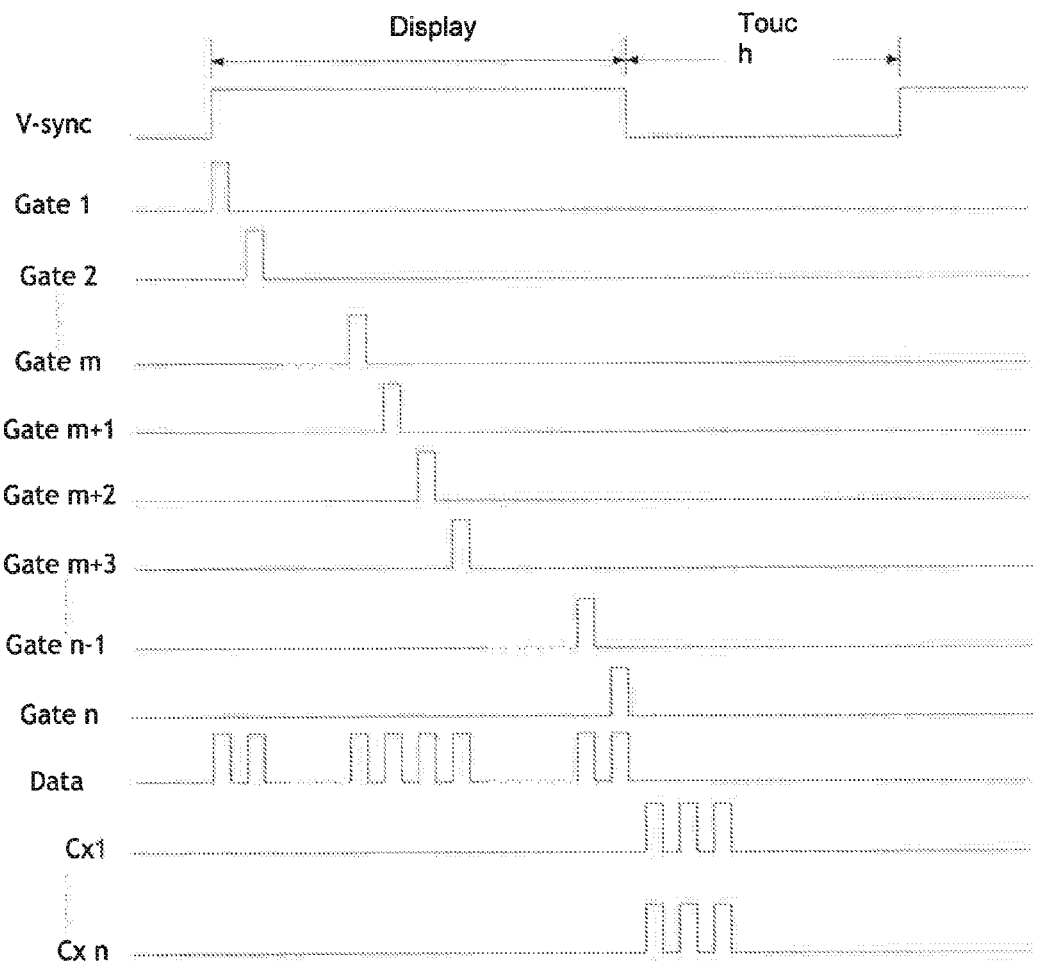
FIGS. 4a and 4b are respectively a drive timing sequence diagram of the in-cell touch panel provided by an embodiment of the present invention.
Figure 4B:
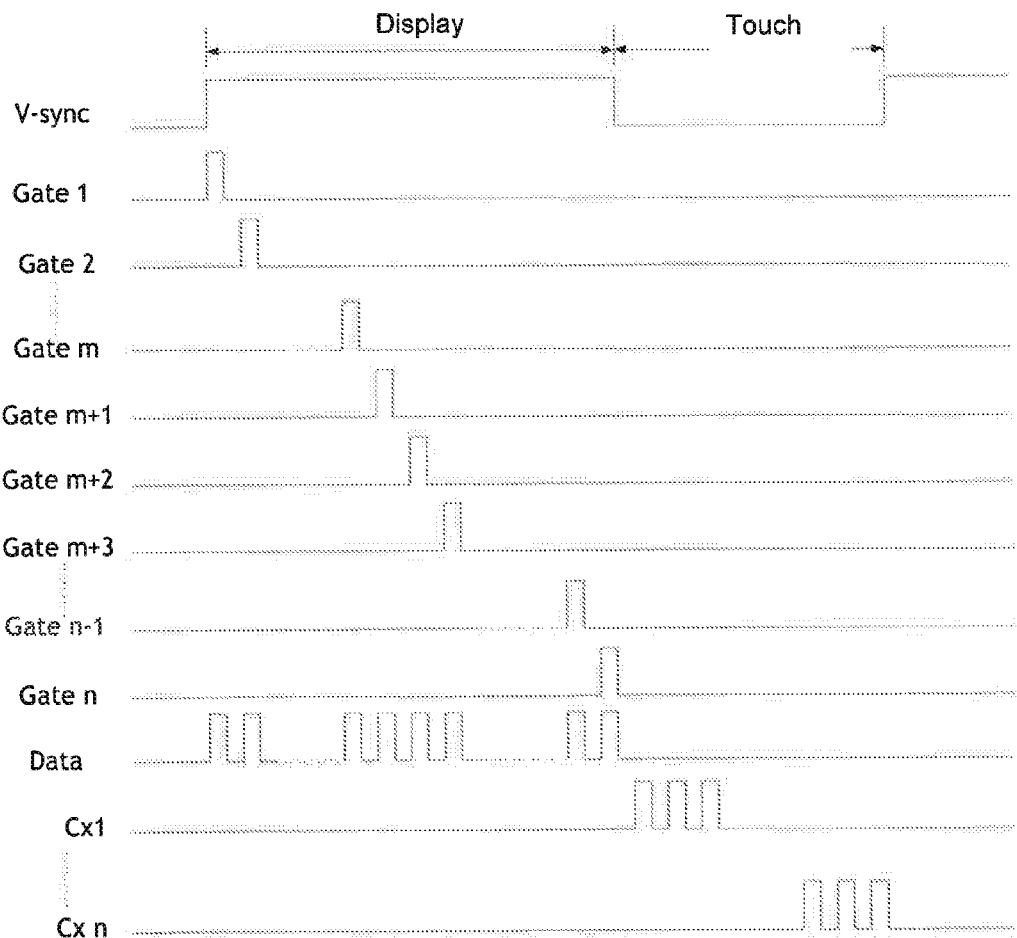

For instance, in the drive timing sequence diagram as shown in FIGS. 4a and 4b, the time of the touch panel for displaying each frame (V-sync) is divided into display period (Display) and touch period (Touch). In the drive timing sequence diagram, the time of the touch panel for displaying one frame is 16.7 ms, in which 5 ms is selected as a touch period and the remaining 11.7 ms is taken as a display period. Of course, the duration of the touch period and the display period may also be appropriately adjusted according to the processing capability of an IC. No specific limitation will be given here. In the display period (Display), a gate scanning signal is applied to each gate signal line Gate 1, Gate 2 . . . Gate n in the touch panel in sequence, and gray-scale signals are applied to data signal lines Data; and the touch detection chip connected with the self-capacitance electrodes Cx 1 . . . Cx n is configured to apply common electrode signals to the self-capacitance electrodes Cx 1 . . . Cx n respectively to achieve the function of liquid crystal display. In the touch period (Touch), as illustrated in FIG. 4a, the touch detection chip connected with the self-capacitance electrodes Cx 1 . . . Cx n is configured to apply drive signals to the self-capacitance electrodes Cx 1 . . . Cx n simultaneously and receive feedback signals of the self-capacitance electrodes Cx 1 . . . Cx n simultaneously; or as illustrated in FIG. 4b, the touch detection chip connected with the self-capacitance electrodes Cx 1 . . . Cx n is configured to apply drive signals to the self-capacitance electrodes Cx 1 . . . Cx n sequentially and receive feedback signals of the self-capacitance electrodes Cx 1 . . . Cx n respectively. No limitation will be given here. Whether touch occurs is determined by the analysis of the feedback signals, so that the touch function can be achieved.

Moreover, in the in-cell touch panel provided by at least one embodiment of the present invention, as the body capacitance acts on the self-capacitance of the self-capacitance electrode 03 by direct coupling, when a human body touches the screen, only the capacitance of the self-capacitance electrodes 03 below the touch position experiences large variation and the capacitance of the self-capacitance electrodes 03 adjacent to the self-capacitance electrodes 03 below the touch position suffers from very small variation. In this way, in the process of sliding on the touch panel, the touch coordinate in an area provided with the self-capacitance electrodes 03 cannot be determined. In view of this, in the in-cell touch panel provided by at least one embodiment of the present invention, both opposite sides of two adjacent self-capacitance electrodes 03 may be set to be zigzag lines to increase the capacitance variation of the self-capacitance electrodes 03 adjacent to the self-capacitance electrodes 03 below the touch position.

Figure 5A:
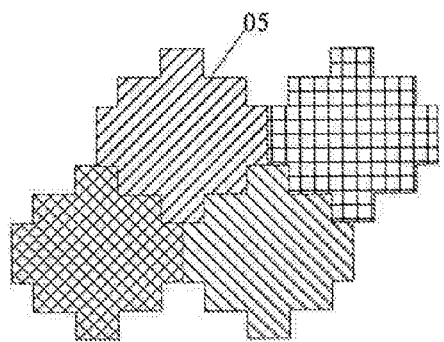
FIGS. 5a and 5b are respectively a schematic structural view of the in-cell touch panel provided by an embodiment of the present invention in which opposite sides of adjacent self-capacitance electrodes are set to be zigzag lines.
Figure 5B:
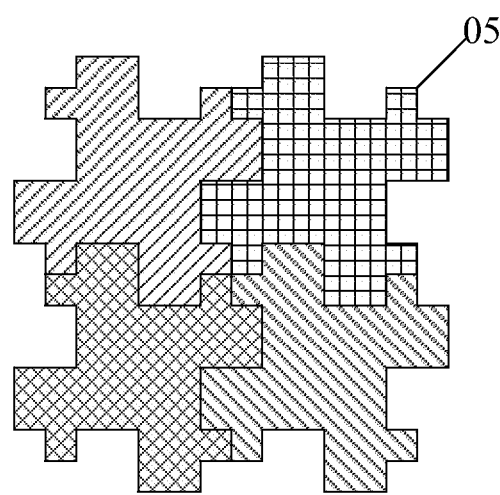

For instance, the overall shape of the self-capacitance electrodes 03 may be set by one or a combination of the following two ways:
1. Both the opposite sides of the two adjacent self-capacitance electrodes 03, being zigzag lines, may be set to have stepped structures, and the two stepped structures have consistent shape and match with each other, as shown in FIG. 5a which illustrates 2*2 self-capacitance electrodes 03.
2. Both the opposite sides of the two adjacent self-capacitance electrodes 03, being zigzag lines, may be set to have concave-convex structures, and the two concave-convex structures have consistent shape and match with each other, as shown in FIG. 5b which illustrates 2*2 self-capacitance electrodes 03.

In the touch panel provided by at least one embodiment of the present invention, any known patterning process flow may be adopted to form layers on the array substrate 02, for instance, eight (8) patterning processes may be adopted: patterning of gate electrodes and gate lines, patterning of active layers, patterning of a first insulating layer, patterning of data lines and source/drain electrodes, patterning of a resin layer, patterning of pixel electrodes, patterning of a second insulating layer, and patterning of a common electrode layer. Moreover, 7, 6 or 5 patterning processes may also be adopted as required. No limitation will be given here.

At least one embodiment of the present invention further provides a display device, which comprises the in-cell touch panel provided by at least one embodiment of the present invention. For instance, the display device may be: any product or component with display function such as a mobile phone, a tablet PC, a TV, a display, a notebook computer, a digital picture frame, a navigator or the like. The embodiments of the display device may refer to the embodiments of the in-cell touch panel. No further description will be given here.

In the in-cell touch panel and the display device, provided by at least one embodiment of the present invention, the plurality of self-capacitance electrodes mutually independently arranged in the same layer are disposed on the array substrate in accordance with the self-capacitance principle; the touch detection chip can determine the touch position by the detection of the capacitance variation of the self-capacitance electrode in a touch period; and the leads arranged in the same layer as the pixel electrodes are disposed at the gaps between the pixel electrodes and configured to connect the self-capacitance electrodes to the touch detection chip. In the touch panel provided by at least one embodiment of the present invention, the pattern of the pixel electrode layer is designed to form the leads connected with the self-capacitance electrodes at the gaps between the pixel electrodes. Therefore, compared with the manufacturing processes of two layers must be added on the basis of the process for manufacturing an array substrate, the touch function can be achieved by only adding one process for forming the self-capacitance electrodes, so that the manufacturing cost can be reduced and the productivity can be improved.

The foregoing is only the preferred embodiments of the present invention and not intended to limit the scope of protection of the present invention. The scope of protection of the present invention should be defined by the appended claims.

The application claims priority to the Chinese patent application No. 201410240491.7, filed May 30, 2014, the disclosure of which is incorporated herein by reference as part of the application.

The invention claimed is:
1. An in-cell touch panel, comprising:
an array substrate provided with pixel electrodes;
a plurality of self-capacitance electrodes mutually independently arranged in a first layer and disposed on the array substrate;
a touch detection chip configured to determine a touch position by detection of capacitance variation of the self-capacitance electrodes; and
leads arranged in a second layer with the pixel electrodes, each of the leads being disposed at a corresponding gap between two adjacent pixel electrodes and connected to a corresponding one of the self-capacitance electrodes through a via hole to establish a connection between the corresponding one of the self-capacitance electrodes and the touch detection chip, wherein an orthographic projection of a gap between two adjacent self-capacitance electrodes on the array substrate is disposed at a gap between two adjacent pixel electrodes.

2. The in-cell touch panel according to claim 1, wherein the leads are of a horizontal strip structure, a vertical strip structure or a crisscrossed latticed structure.

3. The in-cell touch panel according to claim 2, wherein the self-capacitance electrodes as a whole constitute a common electrode layer disposed on the array substrate.

4. The in-cell touch panel according to claim 3, wherein the common electrode layer is disposed between the pixel electrodes and the array substrate, or the pixel electrodes are disposed between the common electrode layer and the array substrate.

5. The in-cell touch panel according to claim 4, wherein the pixel electrodes are disposed between the common electrode layer and the array substrate, the common electrode layer is provided with strip slots at areas opposite to the pixel electrodes; and the common electrode layer is divided into the plurality of self-capacitance electrodes along the strip slots and a direction intercrossing the strip slots.

6. The in-cell touch panel according to claim 2, wherein both opposite sides of two adjacent self-capacitance electrodes are zigzag lines.

7. The in-cell touch panel according to claim 6, wherein the opposite sides of the two adjacent self-capacitance electrodes, being zigzag lines, have stepped structures; and the two stepped structures have consistent shape and match with each other.

8. The in-cell touch panel according to claim 6, wherein the opposite sides of the two adjacent self-capacitance electrodes, being zigzag lines, have concave-convex structures; and the two concave-convex structures have consistent shape and match with each other.

9. The in-cell touch panel according to claim 1, wherein the self-capacitance electrodes as a whole constitute a common electrode layer disposed on the array substrate.

10. The in-cell touch panel according to claim 9, wherein the common electrode layer is disposed between the pixel electrodes and the array substrate, or the pixel electrodes are disposed between the common electrode layer and the array substrate.

11. The in-cell touch panel according to claim 9, wherein both opposite sides of two adjacent self-capacitance electrodes are zigzag lines.

12. The in-cell touch panel according to claim 11, wherein the opposite sides of the two adjacent self-capacitance electrodes, being zigzag lines, have stepped structures; and the two stepped structures have consistent shape and match with each other.

13. The in-cell touch panel according to claim 12, wherein the opposite sides of the two adjacent self-capacitance electrodes, being zigzag lines, have concave-convex structures; and the two concave-convex structures have consistent shape and match with each other.

14. The in-cell touch panel according to claim 10, wherein the pixel electrodes are disposed between the common electrode layer and the array substrate, the common electrode layer is provided with strip slots at areas opposite to the pixel electrodes; and the common electrode layer is divided into the plurality of self-capacitance electrodes along the strip slots and a direction intercrossing the strip slots.

15. The in-cell touch panel according to claim 1, wherein both opposite sides of two adjacent self-capacitance electrodes are zigzag lines.

16. The in-cell touch panel according to claim 15, wherein the opposite sides of the two adjacent self-capacitance electrodes, being zigzag lines, have stepped structures; and the two stepped structures have consistent shape and match with each other.

17. The in-cell touch panel according to claim 15, wherein the opposite sides of the two adjacent self-capacitance electrodes, being zigzag lines, have concave-convex structures; and the two concave-convex structures have consistent shape and match with each other.

18. A display device, comprising the in-cell touch panel according to claim 1.

* * * * *